United States Patent [19]
Kaneko et al.

[11] Patent Number: 5,602,517
[45] Date of Patent: Feb. 11, 1997

[54] LAMINATE TYPE LC COMPOSITE DEVICE HAVING COILS WITH OPPOSING DIRECTIONS AND ADJACENT LEADS

[75] Inventors: Toshimi Kaneko, Sabae; Hiromichi Tokuda, Takefu; Yasuhiro Nakata, Fukui, all of Japan

[73] Assignee: Murata Manufacturing Co., Ltd., Nagaokakyo, Japan

[21] Appl. No.: 507,713

[22] Filed: Jul. 26, 1995

[30] Foreign Application Priority Data

Jul. 29, 1994 [JP] Japan .................................. 6-178174

[51] Int. Cl.⁶ .................................................. H03H 7/01
[52] U.S. Cl. ........................ 333/185; 336/200; 336/232
[58] Field of Search ................................... 333/167, 177, 333/181, 185; 336/200, 232, 205

[56] References Cited

FOREIGN PATENT DOCUMENTS

| 57-68913 | 4/1982 | Japan | 333/185 |
| 3-155609 | 7/1991 | Japan | 333/181 |
| 4-257112 | 9/1992 | Japan | 333/185 |
| 5-267972 | 10/1993 | Japan | 333/168 |

*Primary Examiner*—Benny T. Lee
*Assistant Examiner*—Justin P. Bettendorf
*Attorney, Agent, or Firm*—Burns, Doane, Swecker & Mathis, LLP

[57] ABSTRACT

A laminate type LC composite device which has two coil sections each of which is a laminate of coil conductors and insulating sheets and a capacitor section which is a laminate of capacitor conductors and dielectric sheets. The LC composite device has at least two coils, and the coils are coiled in mutually opposite directions.

2 Claims, 4 Drawing Sheets

LAMINATE TYPE LC COMPOSITE DEVICE HAVING COILS WITH OPPOSING DIRECTIONS AND ADJACENT LEADS

BACKGROUND OF THE INVENTION

1. Field of the Invention

The present invention relates to a laminate type LC composite device, and more particularly to a laminate type LC composite device which is employed in a noise filter circuit or the like.

2. Description of Prior Art

It is well known that a laminate type LC composite device has at least two coils to form a T type LC circuit or a π type LC circuit. Conventionally, the two coils are coiled in the same direction. Therefore, if a noise current flows in the two coils, magnetic fluxes which occur on the respective coils are superimposed, and a comparatively large crosstalk occurs between the two coils. Thus, noise is easily induced on the coils, which inhibits the noise eliminating effect of the LC composite device.

SUMMARY OF THE INVENTION

An object of the present invention is to provide a laminate type LC composite device which has a smaller cross-talk between coils.

In order to attain the object, a laminate type LC composite device according to the present invention has at least two coils, and the coils are coiled in mutually opposite directions.

In the structure, even if a noise current flows in the coils, since the coiling directions of the coils are opposite, magnetic fluxes which occur on the respective coils counteract each other. Thereby, the crosstalk between the coils is weakened.

BRIEF DESCRIPTION OF THE DRAWINGS

This and other objects and features of the present invention will be apparent from the following description with reference to the accompanying drawings, in which.

DETAILED DESCRIPTION OF THE PREFERRED EMBODIMENTS

Preferred embodiments of the present invention are described with reference to the accompanying drawings.

Figure 1:
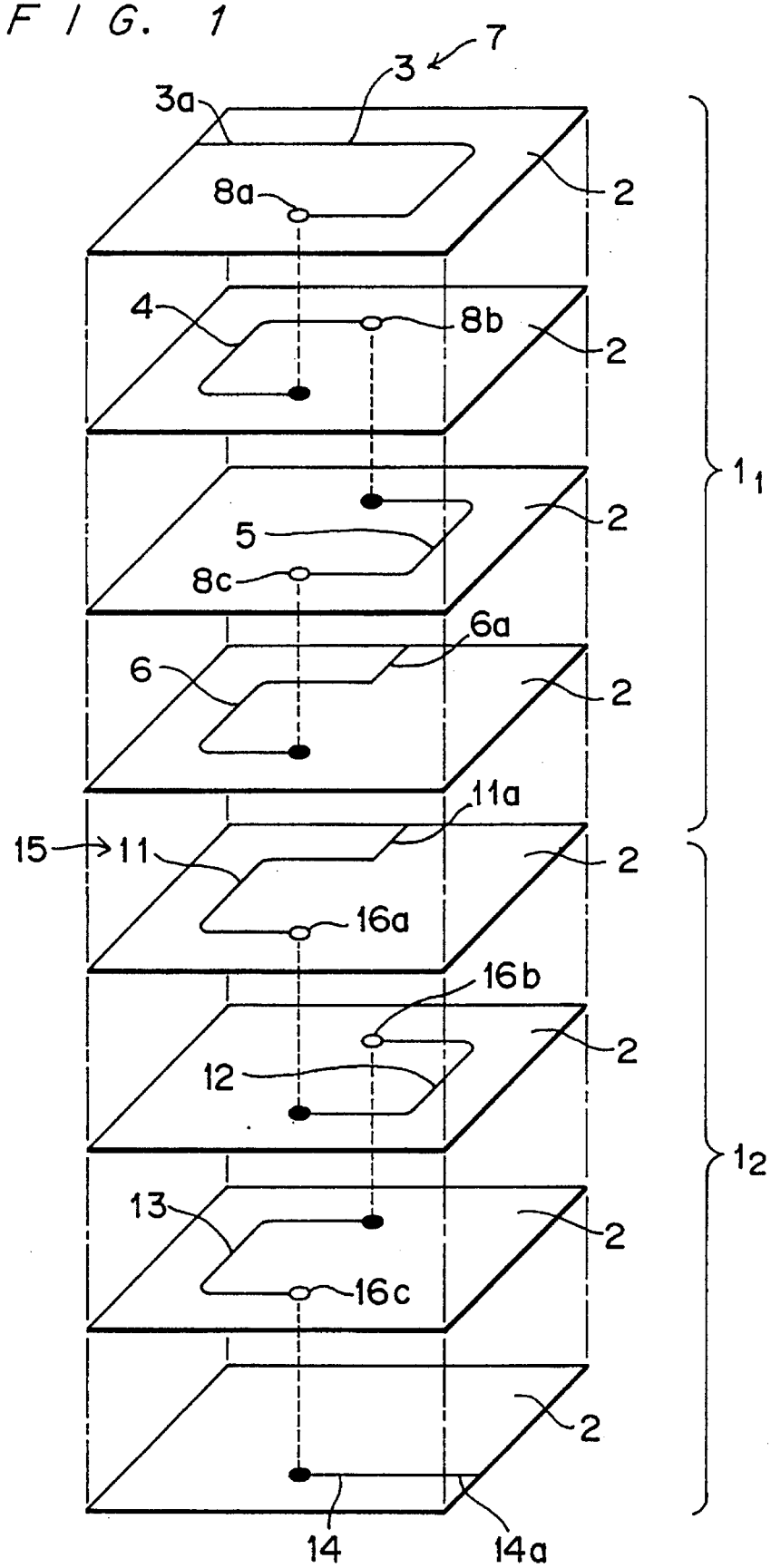
FIG. 1 is an exploded perspective view of coil sections of a laminate type LC composite device which is an embodiment of the present invention.
Figure 2:
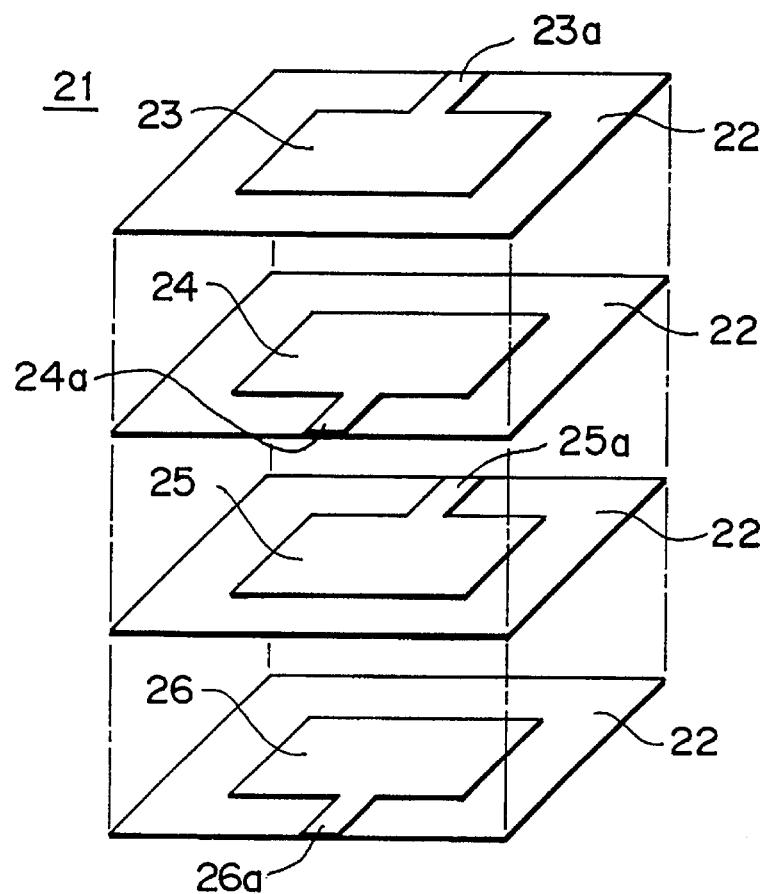
FIG. 2 is an exploded perspective view of a capacitor section of the laminate type LC composite device.

An exemplary LC composite device according to the present invention is composed of coil sections $1_1$ and $1_2$ illustrated in FIG. 1 and a capacitor section 21 illustrated in FIG. 2.

The coil section $1_1$ comprises insulating magnetic sheets 2 which have coil conductors 3, 4, 5, 6 thereon, respectively. The coil section $1_2$ comprises insulating magnetic sheets 2 which have coil conductors 11, 12, 13 and 14 thereon, respectively. The magnetic sheets 2 are made by kneading ferrite powder with a binder and making it into sheets. The coil conductors 3 through 6 and 11 through 14 are formed by printing, sputtering or vapor deposition of Ag, Cu, Ag—Pd or the like. When the magnetic sheets 2 are laminated, the coil conductors 3 through 6 are electrically connected in series through via holes 8a, 8b and 8c made in the sheets 2 to form a spiral coil 7 which has a clockwise coiling direction, and the coil conductors 11 through 14 are electrically connected in series through via holes 16a, 16b and 16c made in the sheets 2 to form a spiral coil 15 which has a counterclockwise coiling direction.

As shown in FIG. 2, the capacitor section 21 comprises dielectric sheets 22 which has capacitor conductors 23, 24, 25 and 26 thereon, respectively. The dielectric sheets 22 are made by kneading ceramic powder with a binder and making it into sheets. The capacitor conductors 23 through 26 are formed by printing, sputtering or vapor deposition of Ag, Cu, Ag—Pd or the like. When the dielectric sheets 22 are laminated, capacities are formed between the capacitor conductors 23 and 25 and the capacitor conductors 24 and 26.

Figure 3:
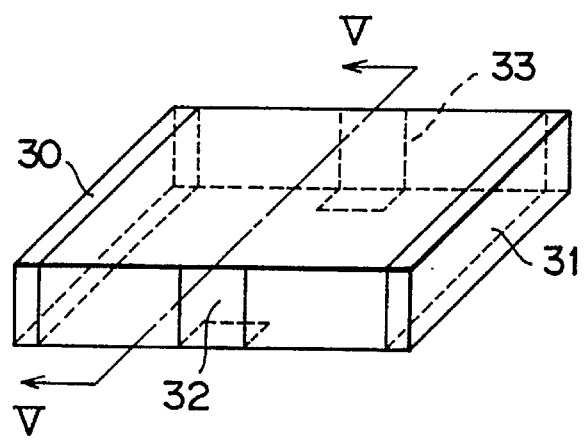
FIG. 3 is a perspective view of the laminate type LC composite device.
Figure 4:
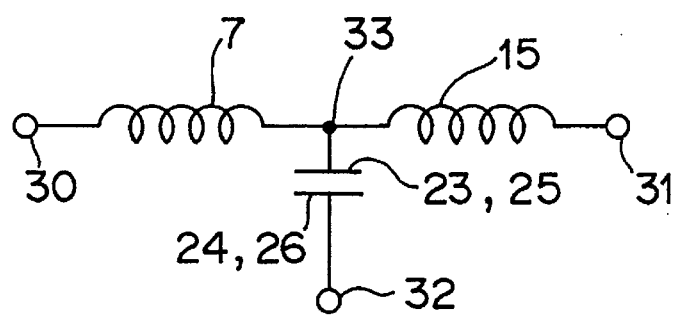
FIG. 4 is an electric equivalent circuit diagram of the laminate type LC composite device of FIG. 3.

The sheets 2 and 22 are laminated as described above, and further insulating sheets with no conductors are put on the top and the bottom. Then, these laminated sheets are sintered together to form a laminate which has coil sections $1_1$ and $1_2$ in the upper portion and a capacitor section 21 in the lower portion. As Shown in FIG. 3, on the right and left ends, on the front end in the center portion and on the rear end in the center portion of the laminate, an input electrode 30, an output electrode 31, a grounding electrode 32 and a junction electrode 33 are formed, respectively, by coating and baking, sputtering or vapor deposition. An end 3a of the coil conductor 3 is electrically in contact with the input electrode 30, and an end 14a of the coil conductor 14 is electrically in contact with the output electrode 31. A leading end 24a of the capacitor conductor 24 and a leading end 26a of the capacitor conductor 26 are electrically in contact with the grounding electrode 32. An end 6a of the coil conductor 6, an end 11a of the coil conductor, a leading end 23a of the capacitor conductor 23 and a leading end 25a of the capacitor conductor 25 are electrically in contact with the junction electrode 33. FIG. 4 shows the electric equivalent circuit of this LC composite device. The LC composite device has a T type LC circuit.

Figure 5:
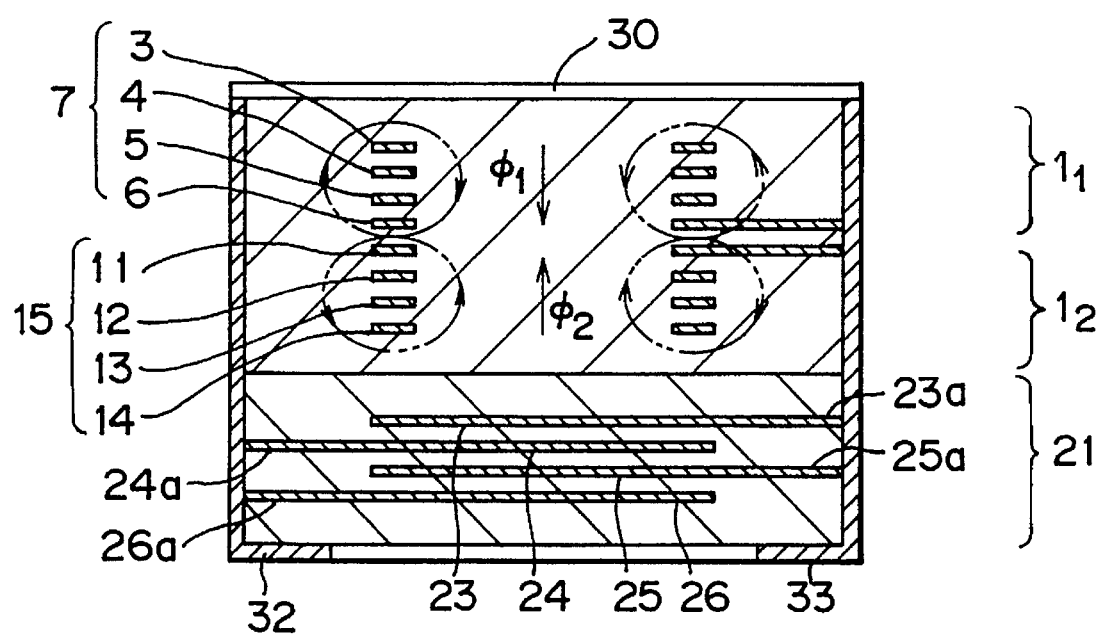
FIG. 5 is a sectional view of the laminate type LC composite device of FIG. 3, taken along the line V—V.

If a noise current flows in the coils 7 and 15, as shown in FIG. 5, since the coiling directions of the coils 7 and 15 are mutually opposite, magnetic fluxes φ1 and φ2 which occur on the coils 7 and 15 counteract each other. Thereby, the crosstalk between the coils 7 and 15 is weakened. Thus, the LC composite device has an improved noise eliminating effect.

Figure 6:
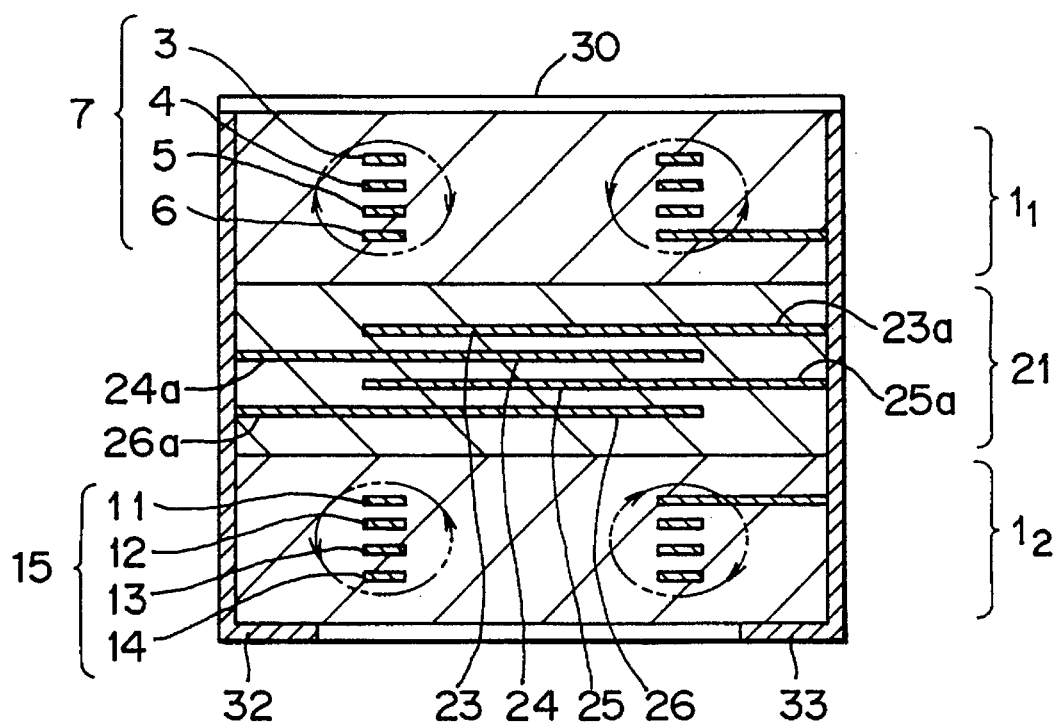
FIG. 6 is a sectional view of a laminate type LC composite device which is another embodiment of the present invention.

The coil sections and the capacitor section can be arranged arbitrarily. FIG. 6 shows another example of arranging the coil sections and the capacitor section. In the structure of FIG. 6, the capacitor section 21 is between the coil sections $1_1$ and $1_2$.

The present invention is applicable to any type of LC composite device as long as the device has two coils, for example, a π type LC circuit, an array type circuit as well as the T type LC circuit. Further, the present invention is applicable to other composite devices, for example, LCR composite devices as well as LC composite devices.

Although in the above embodiment, the magnetic sheets and the dielectric sheets are laminated and then sintered together, the LC composite device can be produced in other methods. For example, the following method is possible. Paste of insulating material is coated and dried by printing or the like to form an insulating film, and paste of conductive material is coated and dried on the insulating film to form a coil conductor (or a capacitor conductor). By repeating these processes, a laminate type LC composite device can be produced.

Although the present invention has been described in connection with the preferred embodiment, it is to be noted that various changes and modifications are possible to those who are skilled in the art. Such changes and modifications are to be understood as being within the scope of the present invention.

What is claimed is:

1. A laminate type LC device having first and second opposing main surfaces, first and second opposing side surfaces, and third and fourth opposing side surfaces, the laminate type LC composite device comprising:

a first coil section which has a first spiral coil;

a second coil section which has a second spiral coil, the second spiral coil having a coiling direction opposite to a coiling direction of the first spiral coil; and a capacitor section;

wherein:
the first coil section, the second coil section and the capacitor section are laminated such that the second coil section is between the first coil section and the capacitor section;

a first leading portion of the first spiral coil and a first leading portion of the second spiral coil are led to the first side surface; and a second leading portion of the first spiral coil is led to the third side surface and a second leading portion of the second spiral coil is led to the fourth side surface, said first leading portions of said first spiral coil and of said second spiral coil being arranged adjacent in a direction from the first main surface to the second main surface at a location along said direction which is between said second leading portions of said first and second spiral coils.

2. A laminate type LC composite device having first and second opposing main surfaces, first and second opposing side surfaces, and third and fourth opposing side surfaces, the laminate type LC composite device comprising:

a first coil section which is a laminate of first coil conductors and first insulating sheets, the first coil conductors being electrically connected in series to form a first spiral coil;

a second coil section which is a laminate of second coil conductors and second insulating sheets, the second coil conductors being electrically connected in series to form a second spiral coil which has a coiling direction opposite to a coiling direction of the first spiral coil; and a capacitor section which is a laminate of capacitor conductors and insulating sheets;

wherein:
the first coil section, the second coil section and the capacitor section are laminated such that the second coil section is between the first coil section and the capacitor section;

a first leading portion of the first spiral coil and a first leading portion of the second spiral coil are led to the first side surface; and a second leading portion of the first spiral coil is led to the third side surface and a second leading portion of the second spiral coil is led to the fourth side surface, said first leading portions of said first spiral coil and of said second spiral coil being arranged adjacent in a direction from the first main surface to the second main surface at a location along said direction which is between said second leading portions of said first and second spiral coils.

* * * * *